(12) United States Patent
Seth et al.

(10) Patent No.: US 7,852,110 B2
(45) Date of Patent: Dec. 14, 2010

(54) CONTROLLING THE SLEW-RATE OF AN OUTPUT BUFFER

(75) Inventors: Sumantra Seth, Bangalore (IN); Sneha Teresa Thomas, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/467,311

(22) Filed: May 18, 2009

(65) Prior Publication Data

US 2009/0289669 A1 Nov. 26, 2009

(30) Foreign Application Priority Data

May 21, 2008 (IN) .................. 1235/CHE/2008

(51) Int. Cl.
*H03K 19/003* (2006.01)
(52) U.S. Cl. .......................................... 326/29; 326/27
(58) Field of Classification Search ............. 326/26–27, 326/29, 83, 86–87; 327/170, 108, 109
See application file for complete search history.

(56) References Cited

U.S. PATENT DOCUMENTS

| 4,906,867 | A  | * | 3/1990  | Petty ........................... 326/27 |
| 7,245,165 | B2 | * | 7/2007  | De Langen ................. 327/170 |
| 7,471,111 | B2 | * | 12/2008 | Seth et al. ..................... 326/83 |
| 2009/0066381 | A1 | * | 3/2009 | Anderson et al. ........... 327/170 |

OTHER PUBLICATIONS

"Design Guide for a Low Speed Buffer for the Universal Serial Bus", Intel Corporation, Dec. 1996, pp. 1-35, Revision 1.1.
Ahmad B. Dowlatabadi, "A Robust, Load-Insensitive Pad Driver", IEEE Journal of Solid State Circuits, pp. 660-665, Apr. 4, 2000, vol. 35.
E Garcia, P. Coll, and D. Auvergne, "Design of a Slew Rate Controlled Output Buffer", ASIC Conference Year1998, pp. 147-150.
Soon-Kyun Shin, Seok-Min Jung, Jin-Ho Seo, Member, IEEE, Myeong-Lyong Ko, and Jae-Whui Kim, "A Slew-Rate Controlled Output Driver Using PLL as Compensation Circuit", IEEE Journal of Solid State Circuits, Jul. 2003, pp. 1227-1233, vol. 38.
Gajendra P. Singh and Raoul B. Salem, "High-Voltage-Tolerant I/O Buffers with Low-Voltage CMOS Process", IEEE Journal of Solid State Circuits, Nov. 1999, pp. 1512-1525, vol. 34.
Anne-Johan Annema et.al, "5.5V Tolerant I/O in a 2.5V 0.25um CMOS Technology", IEEE Custom Integrated Circuits Conference, Year 2000, pp. 417-420.
Héctor Sánchez et.al, "A Versatile 3.3/2.5/1.8-V CMOS I/O Driver Built in a 0.2-μm, 3.5-nm Tox, 1.8-V CMOS Technology", IEEE Solid State Circuits, Nov. 1999, pp. 1501-1511, vol. 34.

* cited by examiner

*Primary Examiner*—James Cho
(74) *Attorney, Agent, or Firm*—Ronald O. Neerings; Wade James Brady, III; Frederick J. Telecky, Jr.

(57) ABSTRACT

An output buffer provided according to an aspect of the present invention is designed to generate an output signal with a slew rate that is substantially independent of the threshold voltage of transistors contained within. An output buffer provided according to another aspect of the present invention provides output signals with different slew rates depending on the magnitude of the load capacitance at the output node of the output buffer.

19 Claims, 5 Drawing Sheets

FIG. 8

CONTROLLING THE SLEW-RATE OF AN OUTPUT BUFFER

RELATED APPLICATION(S)

The present application claims the benefit of co-pending India provisional application serial number: 1235/CHE/2008, entitled: "Slew rate controlled 1.8V open drain buffer with novel piecewise linear dependency over load cap in UDSM CMOS process (90 nm/65 nm and beyond)", filed on May 21, 2008, naming Texas Instruments Inc. (the intended assignee) as the Applicant, and naming the same inventors as in the present application as inventors, and is incorporated in its entirety herewith.

BACKGROUND OF THE INVENTION

1. Technical Field

Embodiments of the present disclosure relate generally to integrated circuits (IC), and more specifically to controlling the slew-rate of an output buffer.

2. Related Art

An output buffer is generally a circuit that receives an input signal (often in digital form), and provides a corresponding output signal with increased drive (lower output impedance, and therefore ability to drive larger values of loads). Typically, in an IC, the output signal is provided on a pad/pin of the IC. For example, data signals generated internally within a processor unit (e.g., central processing unit), are typically provided in buffered form to external components via corresponding output buffers.

Slew rate of an output buffer is the rate of change with respect to time of the output signal provided by the buffer, and may depend on the value of load connected to the output. With respect to an output buffer that operates on digital signals, slew rate generally refers to the rise and/or fall times of the output signal. The rise (or fall) time may be measured between specified voltage values of the signals, for example, from 10% to 90% of the maximum (or minimum) value, or from 30% to 70% of the maximum (or minimum) value, etc.

The slew rate of an output buffer may be required to be controlled while meeting the specific requirements and/or provide features that can take advantage of the corresponding environment.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An output buffer implemented according an aspect of the present invention contains a detection circuit to detect the magnitude of capacitance at an output node of the output buffer. The detected capacitance value is fedback to a control circuit contained in the output buffer. Based on the feedback, the control circuit controls a current through a capacitor connected to the output node, to generate the output signal with a constant slew rate for load capacitances in one range, and slew rates that vary with load capacitance magnitudes for another range of load capacitances.

An output buffer provided according to an aspect of the present invention is designed to generate an output signal with a slew rate that is substantially independent of the threshold voltage of transistors contained within. The term 'independent of' implies that the variations in the threshold voltage across different ICs (due to factors such as process variations) or within an IC over time (due to factors such as temperature variations) do not affect the slew rate.

In an embodiment, such a feature is obtained by employing a capacitor between a current terminal and a control terminal of a transistor (which provides the output signal of the buffer), and using a control circuit which generates a current through the capacitor. As is well known, the slew rate of the output signal of the transistor is determined by the amount of current flowing through the capacitor. The current is generated (by the control circuit) such that the slew rate is independent of the threshold voltage of the transistor.

An output buffer provided according to another aspect of the present invention provides output signals with different slew rates depending on the magnitude of the load capacitance at the output node of the output buffer. In an embodiment, such a feature is obtained by employing a transistor having a current terminal coupled to an output node (of the output buffer) and a control terminal to receive a control signal which causes the transistor to switch the output signal according to the input signal. A detection circuit detects a capacitance magnitude at the output node and a control circuit causes the transistor to operate with a first slew rate for the output signal if the capacitance magnitude has a first value and to operate with a second slew rate for the output signal if the capacitance magnitude has a second value.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE VIEWS OF DRAWINGS

Example embodiments of the present invention will be described with reference to the accompanying drawings briefly described below.

The drawing in which an element first appears is indicated by the leftmost digit(s) in the corresponding reference number

DETAILED DESCRIPTION

Various embodiments are described below with several examples for illustration.

1. Example Component

Figure 1:
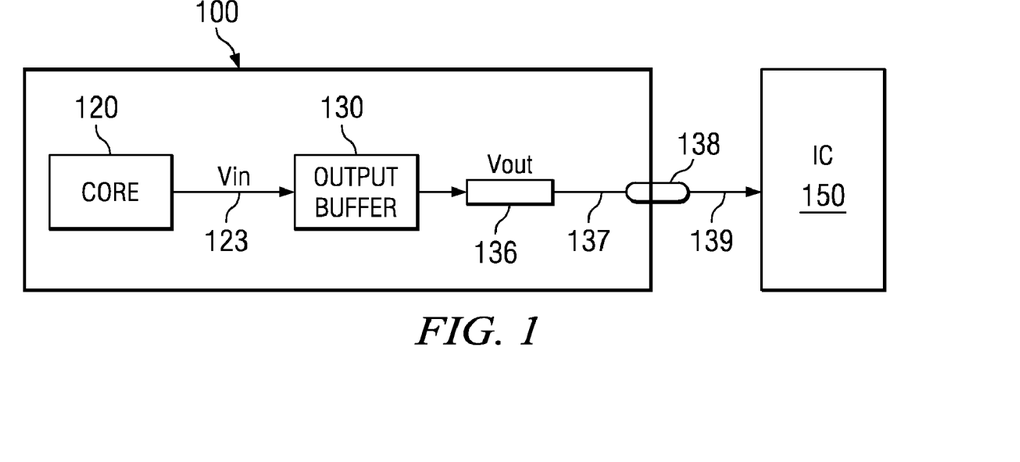
FIG. 1 is a block diagram of an example component in which several features of the present invention can be implemented.

FIG. 1 is a block diagram of an example component in which several aspects of the present invention can be implemented. The diagram is shown containing IC 100 and IC 150. IC 100 is shown containing core 120 and output buffer 130.

Core 120 may correspond to a circuit portion generating digital signals (e.g., a central processing unit), and is shown providing signal 123 (Vin) to output buffer 130. Output buffer 130 processes Vin (123) to generate a buffered output (for example, with increased drive capability, and through lowered output impedance) on pad 136 (Vout) of IC 100. Output signal 136 is provided on pin 138 of IC 100. Pin 138 may be connected to IC 150 through a corresponding trace (139) on a printed circuit board (PCB). Thus, output 136 (Vout) is shown as being provided as an input to IC 150. Path 137 represents a bond wire in IC 100, connecting pad 136 to IC pin 138.

As is well known in the relevant arts, one or more components/circuits connected to pin 138 (and therefore to Vout 136) may offer a load impedance (load) to output 136. In addition, parasitic elements (e.g., capacitance) of PCB trace 139 and bond wire 137 may also add to the total load impedance presented to Vout (136). The combination of impedances of path/pad 136, pin 138, trace 139 and load(s) within IC 150 is referred to conveniently as 'load impedance'.

The rise and/or fall times (slew rate) of Vout (136) may vary based on the value of load impedance. In particular, a higher load capacitance causes the slew rate to be slower (longer rise or fall times). It may be desirable (or required) to control the slew rate to lie within predetermined ranges of values.

Figure 2A:
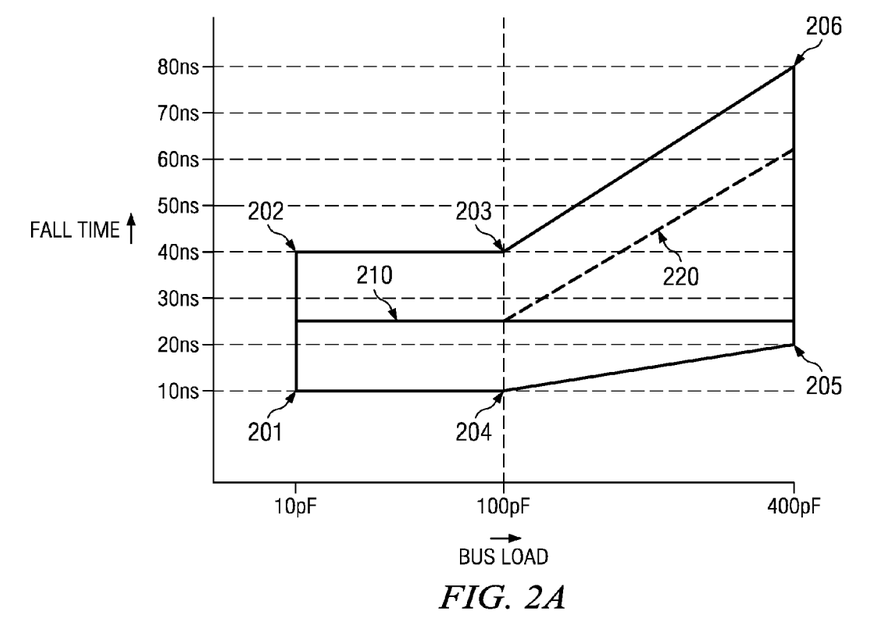
FIG. 2A is a graph illustrating fall-time-versus-bus load requirements specified for an output buffer according to the I²C standard.

FIG. 2A is a graph illustrating fall time versus bus load specified for an output buffer according to the I²C standard. It is noted that I²C standard specifies open-drain outputs, and hence fall time may be of particular consideration for output buffers. It may be observed from FIG. 2A, that the I²C specification specifies that fall time lie in the range 10 nanoseconds (ns) to 40 ns for a bus load capacitance of any value in the range 10 pico-Farad (pF) to 100 pF (shaded rectangle bounded by markers 201, 202, 203 and 204). For the range 100 pF to 400 pF, the fall time is required to have a corresponding value as indicated by the shaded region bounded by markers 203, 204, 205 and 206.

Figure 2B:
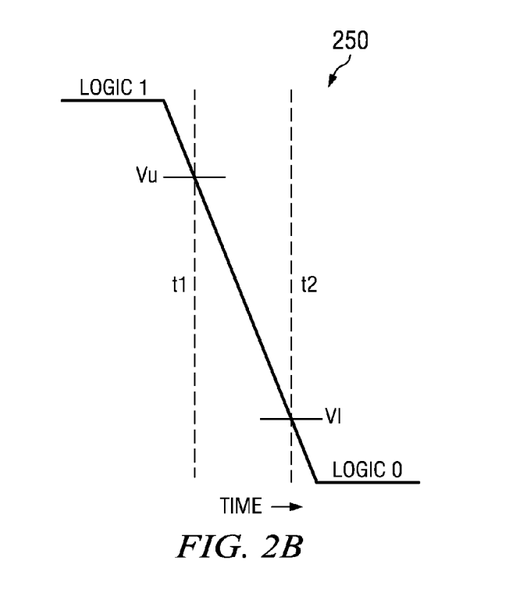
FIG. 2B is a diagram illustrating fall time in an embodiment.

FIG. 2B is a diagram illustrating fall time as is typically specified/measured. Voltage levels Vu and Vl respectively represent 70% and 30% of the logic 1 (high) voltage level of an example output signal 250. Logic 0 represents the voltage level corresponding to logic zero (low) of the signal. The time interval t1-t2 may be specified as the fall time. In other environments (or alternatively), fall (rise) time may be specified between other voltage levels of the signal.

Several features of the present invention enable controlling the slew rate of an output provided by a buffer, as described next with respect to example embodiments.

2. Output Buffer

Figure 3:
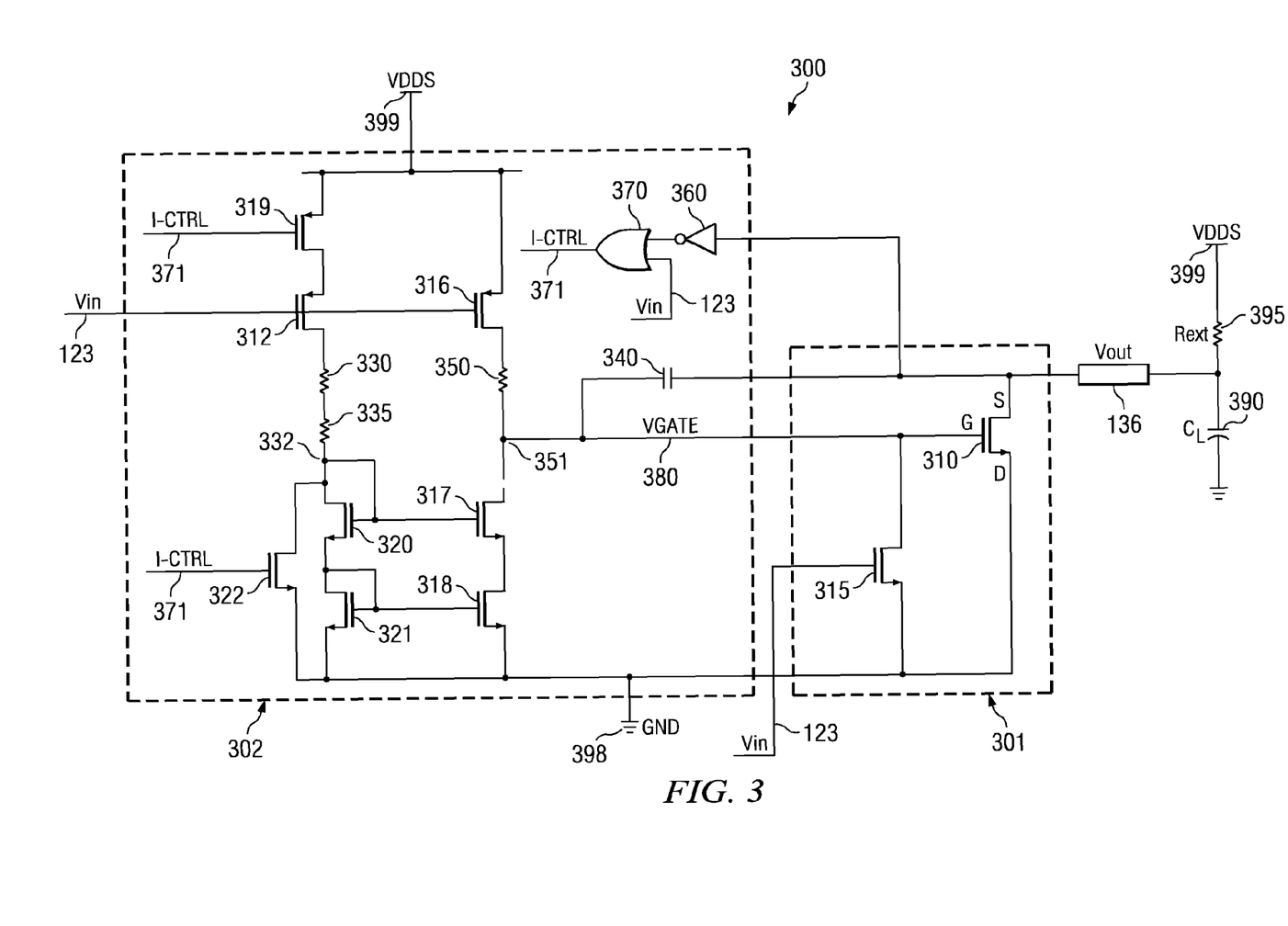
FIG. 3 is a circuit diagram illustrating the details of an output buffer in an embodiment.

FIG. 3 is a circuit diagram illustrating the details of an output buffer in an embodiment of the present invention. Output buffer 300, which may be implemented in place of output buffer 130 of FIG. 1, is shown containing an output circuit 301 and control circuit 302. Output circuit 301 is shown containing NMOS transistors (NMOS) 310 and 315. Control circuit 302 is shown containing PMOS transistors (PMOS) 319, 312, 316, NMOS transistors 317, 318, 320, 321 and 322, resistors 330, 335 and 350, capacitor 340, NOT gate 360 and OR gate 370. It is noted that capacitor 340 is connected to provide negative feedback.

In an embodiment, resistors 330, 335 and 350 have equal resistances (R). Lengths of transistors 317, 318, 320, and 321 are implemented to be each the same as the length of transistor 310, and therefore, the threshold voltage of each of transistors 317, 318, 320, and 321 is rendered substantially the same as that of transistor 310. Further, the sizes (length as well as width) of transistors 317, 318, 320, and 321 are implemented to be the same, and to exhibit a low value of Von (gate-to source voltage in excess of threshold voltage Vt, when the transistors are ON, also termed as overdrive voltage). Input signal Vin (123) may be provided to output buffer 300 with level shifting, as required by the specific implementation.

Gate, source and drain terminals of transistor 310 are respectively marked G, S and D. Power and ground terminals are marked 399 (VDDS) and 398 (GND) respectively. In an embodiment, VDDS has a value of 1.8V (referred to GND (0V)). Drain terminals of transistors 320 and 317 are indicated as nodes 332 and 351 respectively.

Input signal Vin (123) is provided to the gate terminals of transistors 315, 312 and 316. Output of buffer 300 is provided on output node (pad) 136. $C_L$ (390) represents the total capacitive load present at pad 136, and is deemed (as noted above) to include capacitances due to PCB traces, bond wire, IC pin, etc. Pull-up resistor Rext (395) is provided external to the IC containing output buffer 300, but for convenience of illustration is shown connected to pad 136. With respect to FIG. 1, pull-up resistor 395 would be connected between pin 138 and a power supply terminal. Output buffer 300 is, thus, an open-drain buffer in the example of FIG. 3.

First, mathematical expression for the slew rate of output signal Vout (136) is provided according to the equations below:

When Vin (123) goes to logic 0, $$IC1 = (VDDS - Vt)/(R + Ron316) \quad \text{Equation 1}$$

wherein,

IC1 is the current through capacitor 340,

Vt is the threshold voltage of transistors 310, and therefore the voltage at node 351, R denotes the resistance of resistor 350, and Ron316 is the ON resistance of transistor 316.

In equation 1, it is assumed that Von of transistor 310 is negligible, and hence ignored.

$$IC1 \text{ also equals } (C*dV/dt) \quad \text{Equation 2}$$

wherein, dV/dt represents the rate of change of voltage with respect to time across the terminals of capacitor 340, and thus equals the slew rate of Vout (136), and C is the capacitance of capacitor 340.

From equations 1 and 2, $$(VDDS - Vt)/(R + Ron316) = (C*dV/dt) \quad \text{Equation 3}$$

Therefore, $$dV/dt = [(VDDS - Vt)/(R + Ron316)]/C$$

$$\text{i.e., } dV/dt = IC1/C \quad \text{Equation 4}$$

Thus, slew rate of Vout (136) equals IC1/C.

Continuing the description with respect to the operation of output buffer 300, when input signal Vin (123) is at logic high, NMOS 315 is ON, while PMOS 312 and 316 are OFF. As a result, path/node VGATE (380) floats (not connected to any node), and pad 136 (Vout) is pulled-up to logic 1 (high) by resistor 395. Signal/node I-CTRL (371) is at logic high, and transistor 319 is OFF.

When Vin (123) transitions to logic low, I-CTRL (371) goes to logic high. PMOS 312, 316 and 319 switch ON. Transistor 315 switches OFF. Transistor 322 also switches OFF. As a result, a current (I1) flows from VDDS to GND through the path containing transistors 319, 312, resistors 330, 335, and transistors 320 and 321. A current (I2) flows from VDDS to node 351 through the path containing transistor 316, resistor 350. The (approximate) values of currents I1 and I2 are expressed by the following equations, in which the effect of Von is assumed negligible, and hence neglected:

$$I1=(VDDS-2Vt)/(2R) \quad \text{Equation 5}$$

$$I2=(VDDS-Vt)/R \quad \text{Equation 6}$$

wherein,

Vt is the threshold voltage of each of transistors 317, 318, 320, and 321,

R denotes the resistance of each of resistors 330, 335 and 350.

Since transistor-pairs 320 and 317, as well as 321 and 318 are connected in current mirror configuration, the current through transistors 320 and 321 (first path) equals the current through transistors 317 and 318 (second path). Therefore, the current (IC1) flowing through capacitor 340 is the difference of currents I1 and I2, and is expressed (approximately) by the following equation:

$$IC1=VDDS/(2R) \quad \text{Equation 7}$$

From equations 4 and 7, $$dV/dt=VDDS/(2R)/C \quad \text{Equation 8}$$

It may be observed from equation 8, that dV/dt (slew rate) is independent of threshold voltage Vt. It may also be observed that the slew rate depends only on VDDS, R and C, and is therefore independent of load capacitance $C_L$ (390) as well. Further, it may be noted (Equations 7 and 8) that the slew rate is dependent on the value of current IC1 flowing through capacitor 340.

Thus, output buffer 300 provides Vout (136) with a slew rate (fall time in the example) that is constant, as well as independent of variations due to variations in Vt. Thus, output buffer 300 provides a controlled slew rate. By selecting the values of R and C suitably, the slew rate can be designed to have a desired constant value, and to lie within allowable values as represented by shaded area 202, 203, 206, 205, 204, 201 (FIG. 2A). An example slew rate value provided by output buffer 130 is denoted in FIG. 2A by straight line 210. Transistor 315 may be viewed as providing a 'control signal' at the gate terminal of transistor 310 to switch transistor 310 ON or OFF.

Continuing with the operation of output buffer 300, when Vout (136) reaches (or falls below) logic 0, I-CTRL goes to logic 1, and switches OFF transistor 319, thereby switching OFF current I1. OR gate 370 and NOT gate 360 (which may in combination be viewed as a delay circuit) are designed to have sufficient internal signal propagation delays such that current IC1 is not affected during the transition (fall) of output node 136 from logic high to logic low. Once current I1 is cut-off, the voltage at node 351 (as well as on path 380) is determined by current I2. Current I2 stops when VGATE 380 reaches a voltage equal to VDDS, which maintains transistor 310 in the ON state.

According to another aspect of the present invention, in addition to providing a slew rate insensitive to threshold voltage variations, an output buffer detects the value of load capacitance, and provides different slew rates for different ranges of load capacitance values, as described next. It should be appreciated that at least some of the features described below and those described above, can potentially be operated independent of each other.

3. Varying Slew Rate Based on Load Value

Figure 4:
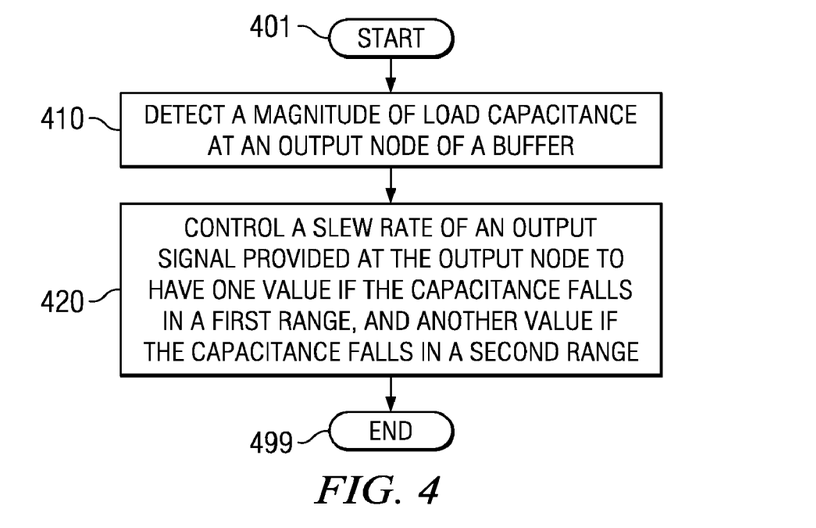
FIG. 4 is a flowchart illustrating the manner in which slew rate of an output of a buffer is controlled, in an embodiment.

FIG. 4 is a flowchart illustrating the manner in which slew rate of an output of a buffer is controlled, according to an aspect of the present invention. The steps in the flowchart are described in a specific sequence merely for illustration. Alternative embodiments in other environments, and using a different sequence of steps, can also be implemented without departing from the scope and spirit of several aspects of the present invention, as will be apparent to one skilled in the relevant arts by reading the disclosure provided herein. The flowchart starts in step 401, in which control passes immediately to step 410.

In step 410, a magnitude of load capacitance (capacitance magnitude) at an output node of a buffer is detected. Control then passes to step 420. In step 420, a slew rate of an output signal provided at the output node is controlled to have one value if the detected capacitance falls in a first range, and another value if the capacitance falls in a second range. Control then passes to step 499, in which the flowchart ends.

An example embodiment in which the features noted in the flowchart are implemented is described next.

4. Circuit

Figure 5:
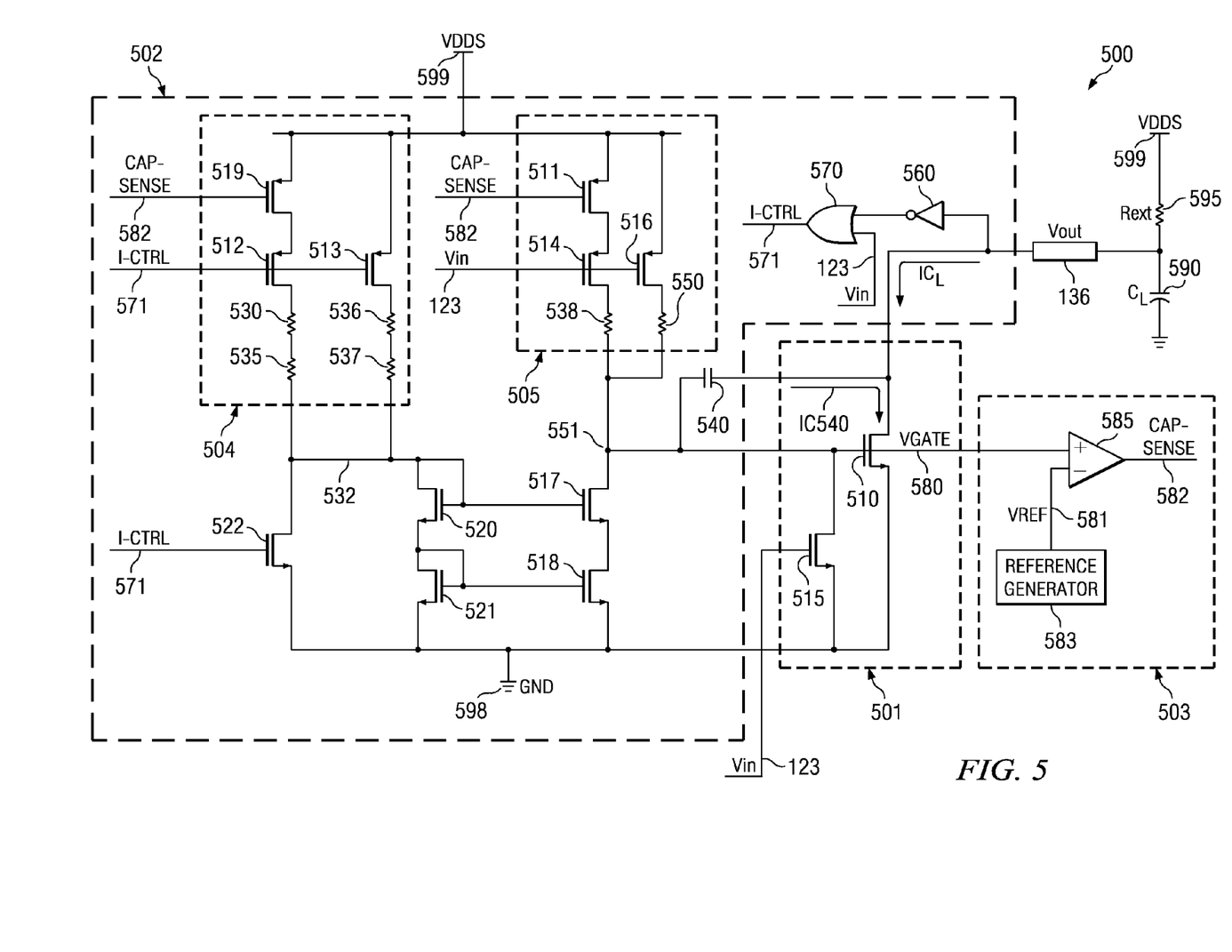
FIG. 5 is a circuit diagram illustrating the details of an output buffer in another embodiment.

FIG. 5 is a circuit diagram of an output buffer in another embodiment of the present invention. Output buffer 500 is shown containing output circuit 501, control circuit 502 and detection circuit 503. Output circuit 501 is shown containing NMOS transistors 510 and 515. Control circuit 502 is shown containing PMOS transistors 519, 511, 512, 513, 514 and 516, NMOS 517, 518, 520, 521 and 522, resistors 530, 535, 536, 537, 538 and 550, capacitor 540, NOT gate 560 and OR gate 570.

It is noted that capacitor 540 is connected to provide negative feedback. Detection circuit 503 is shown containing operational amplifier (OPAMP) 585 and reference generator 583. $C_L$ (590) and Rext (595) respectively represent load capacitance and external pull-up resistor. VDDS (599) and GND (598) respectively represent power supply and ground terminals. Input signal Vin (123) is provided to the gate terminals of transistors 514, 516 and 515. Transistor 515 may be viewed as providing a 'control signal' at the gate terminal of transistor 510 to switch transistor 510 ON or OFF.

Resistors 530, 535, 536, 537, 538 and 550 each have the same resistance value (R). Lengths of each of the transistors 517, 518, 520, and 521 are implemented to be the same as the length of transistor 510, and therefore, the threshold voltage of each of transistors 517, 518, 520, and 521 is rendered substantially the same as that of transistor 510. Input signal Vin (123) may be provided to output buffer 500 with level shifting, as required by the specific implementation.

Transistors 519, 512 and resistors 530 and 535 may be viewed as one arm (first arm), and transistor 513, and resistors 536 and 537 may be viewed as another arm (third arm) of a circuit (504) connected to node 532. Similarly, transistors 511, 514 and resistor 538 may be viewed as an arm (second arm), and transistor 516 and resistor 550 may be viewed as another arm (fourth arm) of a circuit (505) connected to node 551.

Reference generator 583 generates a reference voltage VREF (581) with a value equal to the voltage generated at node VGATE (580) for a predetermined value of $C_L$ (590). With respect to FIG. 2A, the predetermined value of $C_L$ may be selected to equal 100 pF. However, VREF may be generated corresponding to other values of $C_L$ as well. VREF 581 and VGATE 580 are provided as inputs to the inverting and non-inverting terminals respectively of OPAMP 585. Output 582 (CAP-SENSE) of OPAMP 585 is fedback to the gate terminals of transistors 519 and 511.

Analysis of the operation of buffer 500 is provided below for two cases—one when feedback signal CAP-SENSE (582) is at logic low (less than or equal to zero volts), and the other when feedback signal CAP-SENSE (582) is greater than 0V.

CAP-SENSE is at logic low:

For smaller values of load capacitance $C_L$ (e.g., the range 10 pF to 100 pF in FIG. 2A), VGATE (580) has a value less than VREF (581), and CAP-SENSE (582) is at logic low. As a result PMOS 519 and 511 are ON.

When Vin (123) is at logic high, NMOS 515 is ON, and PMOS 514 and 516 are OFF. As a result, transistor 510 is OFF, with the voltage at output node 136 being pulled high to VDDS (599) by Rext (595). I-CTRL (571) is at logic 1, and PMOS 512 and 513 are OFF.

When Vin (123) is at logic low, NMOS 515 switches OFF, and transistors 514 and 516 switch ON. I-CTRL (571) also goes to logic low, thereby switching ON transistors 512 and 513. Thus, when Vin (123) and CAP-SENSE (582) are at logic low, transistors 519, 512, 513, 511, 514 and 516 are ON.

Current mirror pairs (520 and 517), as well as (521 and 518) are also ON. Hence, currents through transistors 520 and 521 equals current through 517 and 518. Therefore, current flowing through capacitor 540 equals the difference between the currents (I3 and I4) flowing into nodes 532 and 551 respectively.

It can be shown using analysis similar to that provided above with respect to FIG. 3 that I3 and I4 can respectively be expressed by equations 5 and 6 above. Therefore current (IC540) through capacitor 540 is as expressed by the following equation (similar to equation 7 above):

$$IC540 = VDDS/R \qquad \text{Equation 9a}$$

Current through capacitor 540 is thus rendered substantially independent of threshold voltage Vt of transistor 510 for reasons similar to those as given above with respect to FIG. 3 (equations 5 through 8), and the analysis is not repeated here in the interest of conciseness.

Hence, for a lower load capacitance range, the fall times of output signal 136 is controlled to be substantially constant as well as independent of threshold voltage Vt and load capacitance $C_L$. Circuit values of FIG. 5 can be designed to obtain fall times for the lower load capacitance range corresponding to, for example, to the portion of line 210 for values of load capacitance in the range 10 pF to 100 pF.

CAP-SENSE is greater than 0V:

For larger values of load capacitance $C_L$ (e.g., the range 10 pF to 100 pF in FIG. 2A), voltage VGATE (580) is a function of (varies with respect to) the load capacitance ($C_L$ 590). When Vin (123) is at logic high, voltage at node 123 is pulled high (to VDDS) by Rext (595).

During the fall time (transition to logic low) of Vin (123) the current flowing into drain terminal of transistor 510 is the sum of current (IC540) through $C_L$, and the current (IC$_L$) contributed by $C_L$, as expressed by the following equation:

$$I510 = IC540 + IC_L \qquad \text{Equation 9b}$$

wherein,

I510 is the current through transistor 510.

Current I510 through transistor 510 may be expressed by the following equation:

$$I510 = K*(VGATE - Vt)^2 \qquad \text{Equation 10}$$

wherein,

K represents a constant determining the current drive of a MOS transistor, and

'*' represents a multiplication operation.

Currents IC540 and IC$_L$ may be expressed by the following equations:

$$IC540 = (-(C540*dV/dt)) \qquad \text{Equation 11}$$

wherein

C540 represents the capacitance of capacitor 540, dV/dt represents the slew rate of output signal 136.

$$IC_L = (-(C_L*dV/dt)) \qquad \text{Equation 12}$$

wherein, $C_L$ represents the load capacitance 590

Combining equations 10, 11 and 12 provides the following relationship:

$$K*(VGATE-Vt)^2 = [(C540*dV/dt) + (C_L*dV/dt)] \qquad \text{Equation 13}$$

The term (VGATE−Vt) equals the overdrive voltage Von. Hence equation 13 reduces to the following expression:

$$(Von)^2 = [(C540 + C_L)*(dV/dt)/K] \qquad \text{Equation 14}$$

However, (dV/dt)=−IC540/C540, and therefore:

$$(Von)^2 = [((C540+C_L)/K)*(IC540/C540)] \qquad \text{Equation 15}$$

Substituting for IC540 from Equation 9a into Equation 15 provides the following expression:

$$(Von)^2 = [1+(C_L/C540)]*(VDDS/2R) \qquad \text{Equation 16}$$

Therefore, $$Von = SQRT\{[1+(C_L/C540)]*(VDDS/2R)\} \qquad \text{Equation 17}$$

wherein, SQRT represent a 'square root of' operation.

It may be observed from Equation 17 that Von has a positive correlation with respect to load capacitance $C_L$. Hence, VGATE (being equal to Vt plus Von) also has a positive correlation with respect to load capacitance $C_L$, and may be viewed as representing the load capacitance $C_L$. However, alternative techniques can also be employed to detect the load capacitance, as will be apparent to one skilled in the relevant arts by reading the disclosure provided herein.

Figure 6:
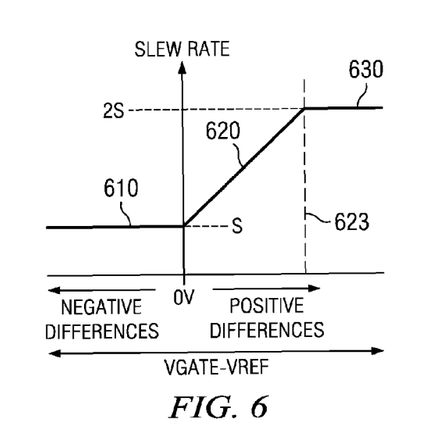
FIG. 6 is a graph illustrating the variation of slew rate in an embodiment.

FIG. 6 is a graph illustrating the variation of slew rate (Y axis) with respect to the difference (X axis) of VGATE and VREF in an embodiment. For a lower range of load capacitance $C_L$, VGATE is less than or equal to VREF, CAP-SENSE is logic low, the fall time has a substantially constant value (S), as denoted by line 610. Transistors 519 and 511 are ON. When Vin (123) transitions to logic low, transistors 512, 513, 514 and 516 are switched ON. Current IC540 is as expressed by equation 9a above.

When load capacitance has a value such that (VGATE−VREF) exceeds 0V by a value (denoted by 623) such that CAP_SENSE is at logic high, transistors 519 and 511 are completely switched OFF. The following equations provide an expression for current IC540:

$$I5 = (VDDS - 2Vt)/(2R) \qquad \text{Equation 18}$$

$$I6 = (VDDS - Vt)/R \qquad \text{Equation 19}$$

wherein

I5 is the current that flows through transistor 513, and resistors 536 and 537, and into node 532, I6 is the current that flows through transistor 516, and resistor 550, and into node 551.

From equations 18 and 19, current IC540 is expressed by the following equation:

$$IC540 = VDDS/2R \qquad \text{Equation 20}$$

Thus, IC 540 has a value half that when CAP-SENSE is at logic low (as given by equation 9a. Therefore, slew rate (which equals IC540/C540) increases to twice the value (2S), as indicated by line 630 in FIG. 6.

For intermediate values of load capacitance, (VGATE–VREF) has positive values to generate CAP-SENSE such that transistors 519 and 511 do not completely switch OFF. As a result, IC540 and hence the slew rate, varies linearly, as depicted by line 620 in FIG. 6. It is noted that line 620 corresponds to line 220 of FIG. 2A.

Thus, for values of VGATE less than (or equal to) VREF, output buffer 500 exhibits a substantially constant slew rate for a range of load capacitance values (such as, for example, the range 10 pF to 100 pF). For VGATE greater than VREF the slew rate increases linearly with respect to load capacitance till a threshold point (623 in FIG. 6) after which the slew rate remains constant again. Control circuit 502 is, therefore, designed to control IC540 to in turn control the slew rate of output signal 136 based on the value of CAP-SENSE (feedback signal).

VREF may be generated to correspond to a desired inflexion point (such as the 100 pF load point in FIG. 2A) in the slew rate characteristics of output 136. With respect to FIG. 2A, the slew rate characteristics of output buffer 500 are denoted by line 210 (for load capacitance-range of 10 pF to 100 pF), and line 220 (for load capacitance-range of 100 pF to 400 pF). It may be appreciated that the specific values above are provided merely by way of illustration, and that modifications to suit other specific environments will be apparent to one skilled in the relevant arts by reading the disclosure provided herein. By generating VREF to have a value corresponding to the value of VGATE for a desired value of load capacitance, the inflexion point may be shifted.

Referring again to FIG. 2A, it may be observed that for the capacitance range 100 pF to 400 pF, slew characteristics represented by line 220 advantageously utilizes the allowed increased range of slew rate values (compared to the portion for capacitances 10 pF to 100 pF). As a result, design limitations on the circuitry (FIG. 5) used to implement output buffer 500 can now be relaxed, thereby potentially minimizing overall design time, design complexity and cost.

Figure 7:
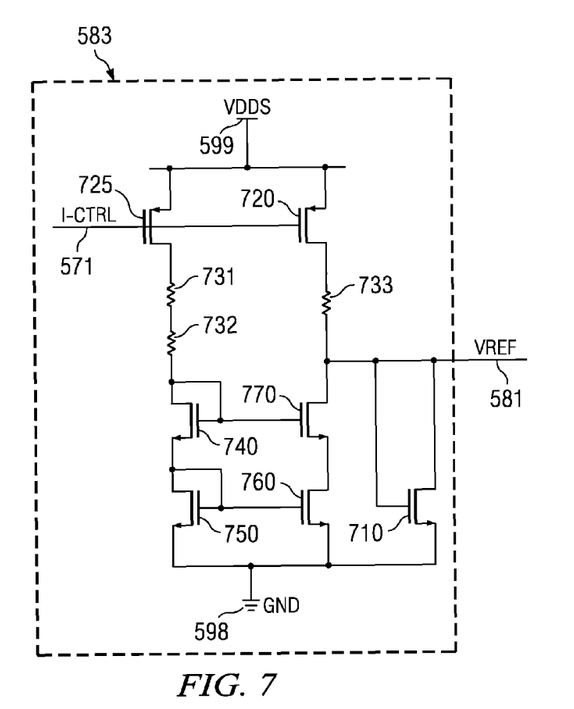
FIG. 7 is a circuit diagram of a reference generator in an embodiment.

FIG. 7 is a circuit diagram of a reference generator in an embodiment of the present invention. Reference generator 583 is shown containing PMOS 720 and 725, NMOS 740, 750, 760, 770 and 710, and resistors 731, 732 and 733. I-CTRL 571, generated by the circuit of FIG. 5, is provided as inputs to the gate terminals of PMOS 725 and 720.

Transistor 710 is implemented to have dimensions corresponding to a desired value of VREF. With respect to FIGS. 2A and 6, for example, the dimensions of transistor 710 may be implemented such that VREF has a value equal to VGATE (of transistor 510) when load capacitance equals 100 pF.

In operation, when I-CTRL (571) is at logic high (corresponding to the conditions when Vin is a logic high or when output signal 136 has completed transition to logic low, VREF has a value equal to Vt (threshold voltage of transistor 710). Under these conditions, detection circuit 503 and the value of CAP-SENSE do not affect the operation of output buffer 500.

When I-CTRL goes to logic low, transistors 725 and 720, current mirror pairs 740/770 and 750/760 switch on, and the voltage at terminal VREF has the predetermined value, as noted above. It may be observed that reference generator 583 is functionally a replica (i.e., having same components and connectivity, not necessarily the same characteristics) of the following circuit portions of control circuit 502 of output buffer 500 of FIG. 5: transistor 513-resistor 536-resistor 537, transistor 516 and resistor 550, and current mirror pairs 520/517 and 521/518, in addition to transistor 710 which is a scaled version of transistor 510 of FIG. 5.

Output buffers 300 and 500, implemented as described above may be incorporated in a system/device, as described next.

5. Device/System

Figure 8:
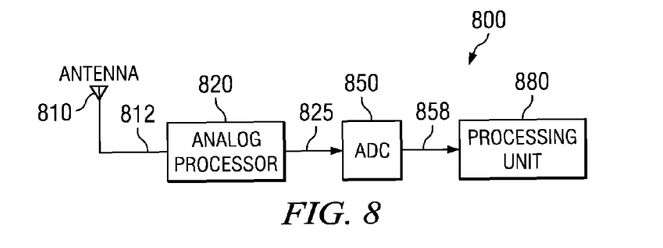
FIG. 8 is a block diagram of a system or device in which several aspects of the present invention may be incorporated.

FIG. 8 is a block diagram of receiver system 800 illustrating an example system in which the present invention may be implemented. Receiver system 800, which may correspond to, for example, a mobile phone is shown containing antenna 810, analog processor 820, ADC 850, and processing unit 880. Each component is described in further detail below.

Antenna 810 may receive various signals transmitted over a wireless medium. The received signals may be provided to analog processor 820 on path 812 for further processing. Analog processor 820 may perform tasks such as amplification (or attenuation as desired), filtering, frequency conversion, etc., on received signals, and provides the resulting signal on path 825.

ADC 850 converts the analog signal received on path 825 to corresponding digital codes. ADC 850 may contain one or more output buffers implemented according to approaches described above, and may provide the digital codes to processing unit 880 on path 858 for further processing, via such output buffers.

Processing unit 880 receives the recovered data to provide various user applications (such as telephone calls, data applications). Processing unit 880 may also contain output buffers implemented using techniques described above for providing data outputs to components or other devices (not shown). For example, processing unit 880 may contain an I$^2$C interface implemented using such output buffers.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as reference potentials, the source (emitter) and drain (collector) terminals of transistors (though which a current path is provided when turned on and an open path is provided when turned off) are termed as current terminals, and the gate (base) terminal is termed as a control terminal.

Furthermore, though the terminals are shown with direct connections to various other terminals, it should be appreciated that additional components (as suited for the specific environment) may also be present in the path, and accordingly the connections may be viewed as being electrically coupled to the same connected terminals.

In addition, the circuit topologies of FIGS. 3, 5, 6 and 7 are merely representative. Various modifications, as suited for the specific environment, without departing from the scope and spirit of several aspects of the present invention, will be apparent to one skilled in the relevant arts by reading the disclosure provided herein.

References throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An output buffer to receive an input signal and provide an output signal at an output node, said output buffer comprising:
   a first transistor having a current terminal coupled to said output node and a control terminal to receive a control signal which causes said first transistor to switch said output signal according to said input signal,
   a capacitor being coupled between said current terminal and said control terminal of said first transistor such that a current flowing through said capacitor determines a slew rate of said output signal; and
   a control circuit to generate said current such that said slew rate is independent of a threshold voltage of said first transistor, wherein a ratio of the magnitude of said current and the capacitance of said capacitor equals said slew rate.

2. The output buffer of claim 1, further comprising:
   a second transistor to provide said control signal,
   said second transistor having a control terminal to receive said input signal,
   a first current terminal coupled to said control terminal of said first transistor to provide said control signal, and
   a second current terminal coupled to a first constant bias terminal.

3. The output buffer of claim 2, wherein said first transistor is a NMOS transistor and said first transistor is configured in an open-drain configuration.

4. The output buffer of claim 3, further comprising:
   a third transistor, a fourth transistor, a first resistor and a second resistor coupled in series with said first path at said first node,
   a fifth transistor and a third resistor coupled in series with said second path at said second node,
   wherein said capacitor is coupled to said second node,
   wherein said input signal is coupled to the control terminal of each of said fourth transistor and said fifth transistor.

5. The output buffer of claim 4, further comprising:
   a sixth transistor with a first current terminal coupled to said first node, a second terminal coupled to said first constant bias terminal; and
   a delay logic having an input coupled to said output node, an output of said delay logic coupled to the control terminal of each of said third transistor and said sixth transistor, the delay caused by said delay logic being greater than a transition time of said output signal.

6. The output buffer of claim 1, wherein said control circuit comprises
   a current mirror which ensures that a first current on a first path equals a second current on a second path,
   said first path being connected to said current mirror at a first node and said second path being connected to said current mirror at a second node,
   wherein each of said first path and said second path is coupled to at least one transistor fabricated on a same die on which said first transistor is also fabricated,
   wherein said capacitor is coupled to receive said current from one of said first path and said second path.

7. An output buffer to receive an input signal and provide an output signal at an output node, said output buffer comprising:
   a first transistor having a current terminal coupled to said output node and a control terminal to receive a control signal which causes said first transistor to switch said output signal according to said input signal;
   a detection circuit to detect a capacitance magnitude at said output node; and
   a control circuit to cause said first transistor to operate with a first slew rate for said output signal if said capacitance magnitude has a first value and to operate with a second slew rate for said output signal if said capacitance magnitude has a second value.

8. The output buffer of claim 7, wherein said control circuit causes the slew rate of said output signal to have a substantially constant value if said capacitance magnitude is in a first range, and to have a positive correlation with said capacitance magnitude if said capacitance magnitude is in a second range.

9. The output buffer of claim 8, wherein said positive correlation is a linear relationship.

10. The output buffer of 8, wherein said detection circuit comprises:
    an operational amplifier having a first input terminal coupled to a control terminal of said first transistor,
    wherein an input voltage at said first input terminal represents said capacitance magnitude.

11. The output buffer of claim 10, wherein said operational amplifier has a second terminal coupled to a reference voltage,
    wherein said operational amplifier generates a feedback signal as an output,
    wherein said feedback signal is at one logic level if the voltage at said first input terminal is less than said reference voltage and is proportional to a difference of the voltage at said first input terminal and said reference voltage otherwise,
    said feedback signal is provided as an input to said control circuit.

12. The output buffer of claim 11, further comprising:
    a capacitor coupled between said control terminal and said current terminal of said first transistor,
    wherein said control circuit is designed to control a current through said capacitor to control the slew rate of said output signal based on said feedback signal.

13. The output buffer of claim 12, wherein said control circuit is designed to generate said current such that the slew rate of said output signal is independent of a threshold voltage of said first transistor.

14. The output buffer of claim 13, further comprising:
    a second transistor to provide said control signal, said second transistor having a control terminal to receive said input signal,
    a first current terminal coupled to said control terminal of said first transistor to provide said control signal, and
    a second current terminal coupled to a first constant bias terminal.

15. The output buffer of claim 14, wherein said control circuit comprises
    a current mirror which ensures that a first current on a first path equals a second current on a second path,
    said first path being connected to said current mirror at a first node and said second path being connected to said current mirror at a second node,
    wherein each of said first path and said second path is coupled to at least one transistor fabricated on a same die on which said first transistor is also fabricated, wherein said capacitor is coupled to receive said current from one of said first path and said second path, wherein each of said first current and said second current is changed to have a positive correlation with a magnitude of said feedback signal.

16. The output buffer of claim 15, further comprises a third transistor, a fourth transistor, a first resistor and a second resistor coupled in series as a first arm, a fifth transistor and a third resistor coupled in series as a second arm, a sixth transistor, a fourth resistor and a fifth resistor coupled in series as a third arm;

a seventh transistor, eighth transistor and a sixth resistor coupled in series as a fourth arm, wherein said first arm and said third arm are coupled in parallel, but together coupled in series with said first path at said first node, wherein said second arm and said fourth arm are coupled in parallel, but together coupled in series with said second path at said second node, wherein said capacitor is coupled to said second node, wherein said input signal is coupled to the control terminal of each of said fourth transistor and said fifth transistor, wherein the control terminal of each of said third transistor and said seventh transistor is coupled to receive said feedback signal.

17. The output buffer of claim 16, further comprising:

a ninth transistor with a first current terminal coupled to said first node, a second terminal coupled to said first constant bias terminal; and a delay logic having an input coupled to said output node, an output of said delay logic coupled to the control terminal of each of said third transistor and said sixth transistor, the delay caused by said delay logic being greater than a transition time of said output signal.

18. The output buffer of claim 11, wherein said reference voltage has a magnitude equal to the magnitude of voltage at said control terminal of said first transistor when said capacitance magnitude is equal to a boundary of said first range and said second range.

19. The output buffer of claim 18, further comprising a reference voltage generator to generate said reference voltage, where said reference voltage generator comprises a replica of said second arm, said fourth arm, said first transistor and said current mirror together.

* * * * *